(12) United States Patent
Harayama et al.

(10) Patent No.: US 11,830,752 B2
(45) Date of Patent: Nov. 28, 2023

(54) SUBSTRATE FIXING DEVICE, ELECTROSTATIC CHUCK, AND METHOD OF MANUFACTURING ELECTROSTATIC CHUCK

(71) Applicant: SHINKO ELECTRIC INDUSTRIES CO., LTD., Nagano (JP)

(72) Inventors: Yoichi Harayama, Nagano (JP); Keiichi Takemoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 298 days.

(21) Appl. No.: 17/346,781

(22) Filed: Jun. 14, 2021

(65) Prior Publication Data

US 2021/0391203 A1 Dec. 16, 2021

(30) Foreign Application Priority Data

Jun. 16, 2020 (JP) ................. 2020-104068

(51) Int. Cl.
| | | |
|---|---|---|
| *H01T 23/00* | (2006.01) | |
| *H01L 21/683* | (2006.01) | |
| *H01L 21/67* | (2006.01) | |
| *H05B 3/03* | (2006.01) | |
| *H05B 3/22* | (2006.01) | |
| *H05B 1/02* | (2006.01) | |

(52) U.S. Cl.
CPC .... *H01L 21/6833* (2013.01); *H01L 21/67103* (2013.01); *H05B 1/0233* (2013.01); *H05B 3/03* (2013.01); *H05B 3/22* (2013.01); *H05B 2203/035* (2013.01)

(58) Field of Classification Search
None
See application file for complete search history.

(56) References Cited

U.S. PATENT DOCUMENTS

| | | |
|---|---|---|
| 2005/0215073 A1 | 9/2005 | Nakamura et al. |
| 2018/0047604 A1 | 2/2018 | Takemoto et al. |
| 2018/0053678 A1* | 2/2018 | Kugimoto ......... H01L 21/67103 |
| 2020/0161103 A1* | 5/2020 | Liu ................... H01J 37/32715 |

FOREIGN PATENT DOCUMENTS

| | | |
|---|---|---|
| JP | 2005-277074 | 10/2005 |
| JP | 2018-26427 | 2/2018 |

* cited by examiner

*Primary Examiner* — Stephen W Jackson
(74) *Attorney, Agent, or Firm* — Rankin, Hill & Clark LLP

(57) ABSTRACT

There is provided a substrate fixing device. The substrate fixing device includes: a base plate; and an electrostatic chuck that is fixed to the base plate and configured to adsorb a subject by electrostatic force. The electrostatic chuck includes: an adsorptive layer configured to adsorb and retain the subject; and a heater layer that is provided between the adsorptive layer and the base plate and configured to heat the subject retrained by the adsorptive layer. A thickness of the heater layer is uniform over an entire area of the heater layer.

9 Claims, 7 Drawing Sheets even when the external heater electrodes that can obtain high heat uniformity are used, there is a problem that a thickness of the insulating resin for adhesively bonding the heater electrodes to the ceramic plate is so uneven that sufficient heat uniformity cannot be obtained. That is, a thickness of a layer of the insulating resin and the heater electrodes disposed on the ceramic plate in the electrostatic chuck may be too uneven to secure sufficiently uniform temperature in the adsorptive face of the ceramic plate.

SUBSTRATE FIXING DEVICE, ELECTROSTATIC CHUCK, AND METHOD OF MANUFACTURING ELECTROSTATIC CHUCK

This application claims priority from Japanese Patent Applications No. 2020-104068, filed on Jun. 16, 2020, the entire contents of which are herein incorporated by reference.

BACKGROUND

Technical Field

The present disclosure relates to a substrate fixing device, an electrostatic chuck and a method for manufacturing the electrostatic chuck.

Background Art

Typically, a substrate fixing device that adsorbs and retains a wafer when, for example, a semiconductor component is manufactured includes an electrostatic chuck (ESC). The electrostatic chuck has a configuration using a ceramic plate in which electrodes are embedded. In the substrate fixing device, the electrostatic chuck is fixed to a base plate. Due to a voltage applied to the electrodes embedded in the ceramic plate, the wafer is adsorbed by the electrostatic chuck using electrostatic force. Since the wafer is adsorbed and retained by the electrostatic chuck, processes such as micromachining, etching, etc. can be efficiently performed on the wafer.

Such an electrostatic chuck may be provided with a temperature adjusting function for adjusting temperature of the wafer. Specifically, for example, a metal paste may be screen-printed to form heater electrodes, and the heater electrodes may be sintered simultaneously when the ceramic plate is formed. Moreover, a technique for etching a metal rolled foil on an insulating resin by photolithography to form external heater electrodes has been also contrived in order to obtain high heat uniformity in a wafer placement face (see e.g., JP-A-2018-026427 and JP-A-2005-277074).

In recent years, as wafers have been micro-machined more greatly, electrostatic chucks for adsorbing the wafers have been also required to have performance with higher heat uniformity. That is, each electrostatic chuck is required to control temperature to be isotherm al all over an adsorptive face thereof.

However, even when the external heater electrodes that can obtain high heat uniformity are used, there is a problem that a thickness of the insulating resin for adhesively bonding the heater electrodes to the ceramic plate is so uneven that sufficient heat uniformity cannot be obtained. That is, a thickness of a layer of the insulating resin and the heater electrodes disposed on the ceramic plate in the electrostatic chuck may be too uneven to secure sufficiently uniform temperature in the adsorptive face of the ceramic plate.

Specifically, the layer of the insulating resin and the heater electrodes is pressed to be adhesively bonded to the ceramic plate. On this occasion, when fluidity of the insulating resin is high, the insulating resin in an outer peripheral portion flows to the outside so that the layer of the insulating resin and the heater electrodes is formed to be varied in thickness between a central portion and the outer peripheral portion. On the other hand, when the fluidity of the insulating resin is low, the variation in thickness still remains even after the layer of the insulating resin and the heater electrodes is pressed to be adhesively bonded to the ceramic plate. As a result, the layer of the insulating resin and the heater electrodes is formed to be uneven in thickness.

The present disclosure provides a substrate fixing device that can obtain sufficiently high heat uniformity, an electrostatic chuck, and a method for manufacturing the electrostatic chuck.

Certain embodiments provide a substrate fixing device. The substrate fixing device comprises: a base plate; and an electrostatic chuck that is fixed to the base plate and configured to adsorb a subject by electrostatic force. The electrostatic chuck comprises: an adsorptive layer configured to adsorb and retain the subject; and a heater layer that is provided between the adsorptive layer and the base plate and configured to heat the subject retrained by the adsorptive layer. A thickness of the heater layer is uniform over an entire area of the heater layer.

Certain embodiments provide an electrostatic chuck. The electrostatic chuck comprises: a heater layer; and an adsorptive layer that is disposed on the heater layer and configured to adsorb and retain a subject by electrostatic force. The heater layer is configured to heat the subject retained by the adsorptive layer. A thickness of the heater layer is uniform over an entire area of the heater layer.

Certain embodiments provide a method for manufacturing an electrostatic chuck. The method comprises: forming an adsorptive layer that comprises an electrode and a ceramic covering the electrode; providing, on the adsorptive layer, a metal foil layer that comprises an insulating resin and a metal foil provided on the insulating resin; patterning the metal foil to form a heater electrode providing an insulating resin on the adsorptive layer so as to cover the heater electrode; and polishing a surface of the insulating resin exposed to an outside.

DESCRIPTION OF EMBODIMENTS

Embodiments of a substrate fixing device, an electrostatic chuck, and a method for manufacturing the electrostatic chuck disclosed by the present application will be described below in detail with reference to the drawings. Incidentally, the present disclosure should not be limited by these embodiments.

Figure 1:
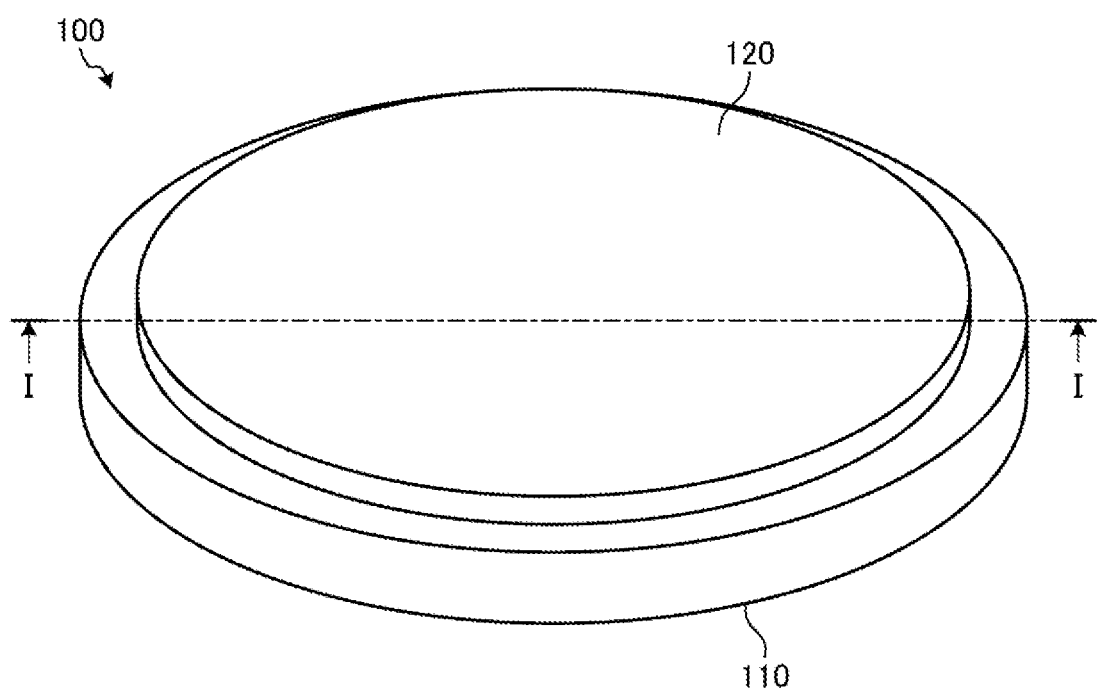
FIG. 1 is a perspective view illustrating a configuration of a substrate fixing device according to an embodiment.

FIG. 1 is a perspective view illustrating a configuration of a substrate fixing device 100 according to an embodiment. The substrate fixing device 100 shown in FIG. 1 has a base plate 110, and an electrostatic chuck 120 that is adhesively bonded to the base plate 110.

The base plate 110 is a circular member that is made of a metal such as aluminum.

The base plate 110 is a substrate to which the electrostatic chuck 120 is fixed. The base plate 110 is, for example, attached to a semiconductor manufacturing apparatus so that the substrate fixing device 100 can function as a semiconductor retaining device for retaining a wafer.

The electrostatic chuck 120 adjusts temperature of a subject such as a wafer while adsorbing the subject using electrostatic force. That is, the electrostatic chuck 120 has a ceramic layer that adsorbs the subject, and a heater layer that heats the subject. The electrostatic chuck 120 having a smaller diameter than the diameter of the base plate 110 is fixed to the center of the base plate 110. On this occasion, the heater layer of the electrostatic chuck 120 is adhesively bonded to the base plate 110 so that the electrostatic chuck 120 is fixed to the base plate 110. The ceramic layer is deposited on an upper face of the heater layer so that an adsorptive face adsorbing the subject is exposed.

Figure 2:
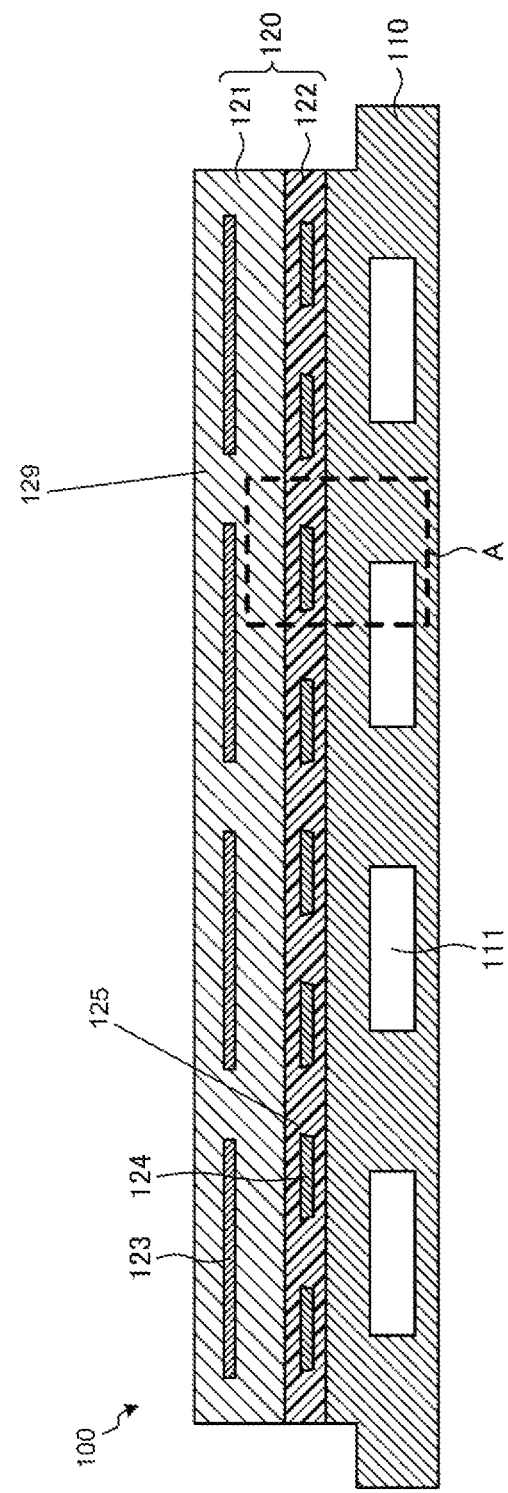
FIG. 2 is a schematic view illustrating a section of the substrate fixing device according to the embodiment.

FIG. 2 is a schematic view illustrating a section take along a line 14 of FIG. 1. As shown in FIG. 2, the electrostatic chuck 120 is adhesively bonded to the base plate 110 in the substrate fixing device 100.

The base plate 110 is a member that is made of a metal and, for example, about 20 to 50 mm thick, and that internally has cooling water pathways 111 serving as flow pathways of cooling water. The base plate 110 cools the electrostatic chuck 120 by the cooling water flowing from the outside of the substrate fixing device 100 into the cooling water pathways 111. As a result of cooling the electrostatic chuck 120, the subject such as the wafer adsorbed by the electrostatic chuck 120 is cooled.

Incidentally, the base plate 110 may have cooling gas pathways in place of the cooling water pathways 111. The cooling gas pathways serve as flow pathways of cooling gas. In short, the base plate 110 is required to have refrigerant flow paths through which any of refrigerants such as the cooling water and the cooling gas is made to pass.

The electrostatic chuck 120 has a ceramic layer 121 and a heater layer 122. The heater layer 122 is adhesively bonded to the base plate 110.

The ceramic layer 121 has electrodes 123, and a ceramic 129 with which the electrodes 123 are covered. The ceramic layer 121 is, for example, about 4.5 mm thick. The ceramic 129 is obtained, for example, by sintering green sheets produced by use of aluminum oxide. When a voltage is applied to the electrodes 123 of the ceramic layer 121, the ceramic layer 121 adsorbs the subject such as the wafer by electrostatic force. That is, in FIG. 2, an upper face of the ceramic layer 121 becomes an adsorptive face so that the subject is adsorbed on the adsorptive face when the voltage is applied to the electrodes 123.

The heater layer 122 is a layer that is, for example, about 200 μm (=0.2 mm) thick, and that includes heater electrodes 124 and an insulating resin 125 with which the heater electrodes 124 are covered. The insulating resin 125 in the surface is precisely polished during formation. As a result, an entire thickness of the heater layer 122 is uniform. That is, the thickness is substantially equal over the whole area of the heater layer 122 so that a difference between a thickest portion and a thinnest portion of the heater layer 122 is, for example, not more than 0.2% of the thickness of the heater layer 122. Therefore, a heat transfer characteristic of the heater layer 122. is uniform, and the whole area of the ceramic layer 121 is uniformly cooled by the base plate 110.

For example, an epoxy resin, a bismaleimide triazine resin, or the like, having high heat conductivity and high heat resistance can be used as the insulating resin 125 forming the heater layer 122. In addition, due to a filler of alumina, aluminum nitride, or the like contained in the insulating resin 125, heat conductivity of the heater layer 122 can be improved. A thickness of the insulating resin 125 between an upper face of the heater electrodes 124 and the ceramic layer 121 is preferably not less than 70 μm.

When a voltage is applied to the heater electrodes 124 of the heater layer 122, the heater electrodes 124 generate heat so that the ceramic layer 121 is heated. As a result, the subject adsorbed by the ceramic layer 121 is heated. Temperature of the ceramic layer 121 is adjusted by the heating performed by the heater electrodes 124 and the cooling performed by the base plate 110 so that the temperature of the subject adsorbed by the ceramic layer 121 can be adjusted to a desired temperature. In the present embodiment, the thickness of the heater layer 122 is uniform. Therefore, the temperature of the ceramic layer 121 can be adjusted uniformly all over the ceramic layer 121. That is, the electrostatic chuck 120 can obtain sufficiently high heat uniformity.

For example, an alloy such as GN49 (constantan) (Cu/Ni/In/Fe alloy), Zeranin (Cu/Mn/Sn alloy), or Manganin (Cu/Mn/Ni alloy) can be used as the material of the heater electrodes 124. In addition, each of the heater electrodes 124 can be made about 25 to 50 μm thick.

Figure 3:
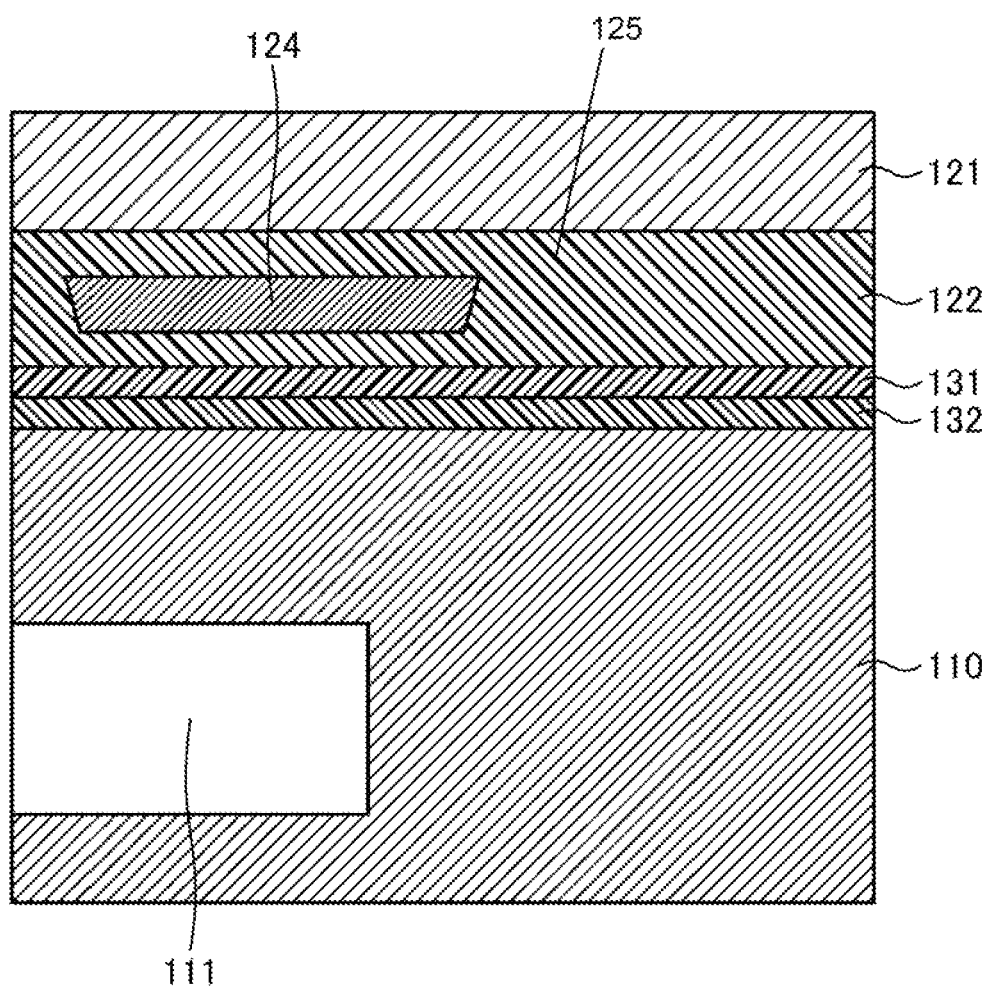
FIG. 3 is an enlarged view illustrating the section of the substrate fixing device according to the embodiment.

FIG. 3 is a view illustrating a portion A of FIG. 2. in an enlarged manner. As shown in FIG. 3, the heater layer 122 is adhesively bonded to the base plate 110 by a silane coupling agent layer 131 and an adhesive agent layer 132.

The silane coupling agent layer 131 improves adhesion between the insulating resin 125 of the heater layer 122 and the base plate through the adhesive agent layer 132. The adhesive agent layer 132 adhesively bonds the heater layer 122 to the base plate 110. For example, a silicone-based adhesive agent can be used as the adhesive agent forming the adhesive agent layer 132. Heat conductivity of the adhesive agent is preferably not less than 2.00 W/mK. In addition, a thickness of the silane coupling agent layer 131 and the adhesive agent layer 132 can be, for example, set in a range of about 0.1 to 3 mm. Incidentally, the adhesive agent layer 132 may be formed from one layer or a plurality of layers.

Figure 4:
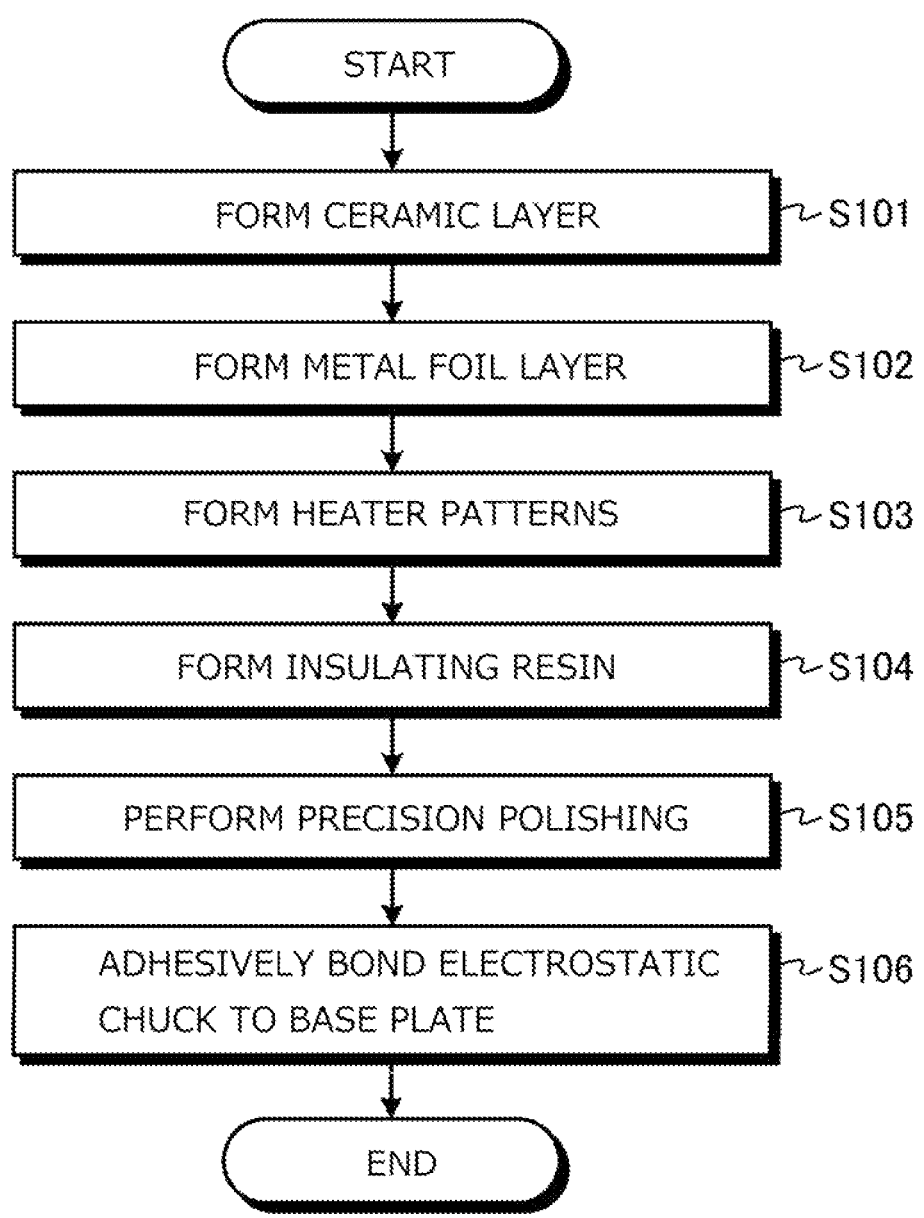
FIG. 4 is a flowchart illustrating a method of manufacturing the substrate fixing device according to an embodiment.

Next, a method for manufacturing the substrate fixing device 100 having the aforementioned configuration will be described with reference to a flowchart shown in FIG. 4.

Figure 5:
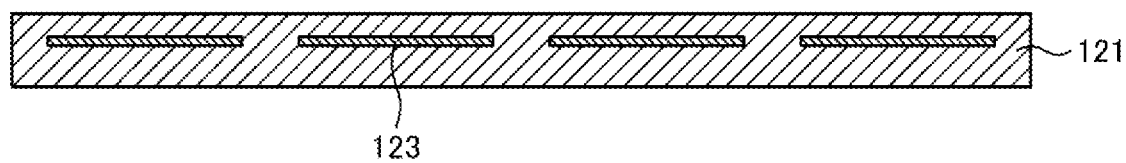
FIG. 5 is a view illustrating a specific example of a ceramic layer forming step.

First, a ceramic layer 121 for adsorbing a subject is formed (step S101). Specifically, for example, a plurality of green sheets using aluminum oxide as a main material are produced, and electrodes 123 are appropriately formed on one face of the green sheets. The electrodes 123 can be formed, for example, by screen-printing a metal paste on the surface of the green sheets. Then, a plurality of green sheets are laminated and sintered. As a result, the ceramic layer 121 is formed. The ceramic layer 121 internally has a layer of the electrodes 123, for example, as shown in FIG. 5.

Figure 6:
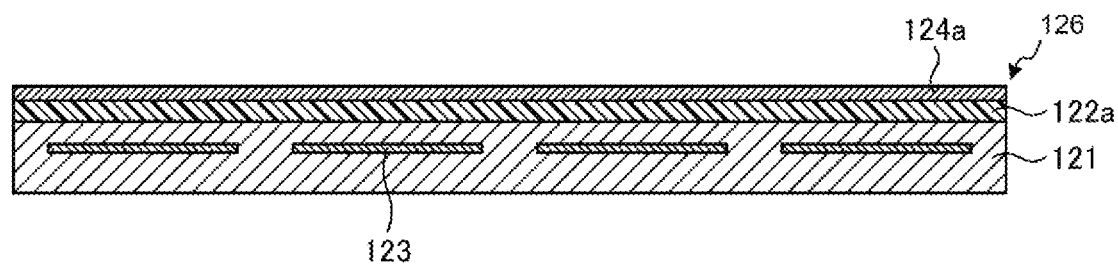
FIG. 6 is a view illustrating a specific example of a metal foil layer forming step.

When the ceramic layer 121 is formed, a metal foil layer 126 including a metal foil 124a and an insulating resin 122a on the surface of the ceramic layer 121 is disposed on one face of the ceramic layer 121 (step S102). Specifically, for example, as shown in FIG. 6, the metal foil layer 126 in which the metal foil 124a is formed on the surface of the insulating resin 122a is disposed on the ceramic layer 121.

For example, an epoxy resin, a bismaleimide triazine resin, or the like, having high heat conductivity and high heat resistance can be used as the insulating resin 122a. The heat conductivity of the insulating resin 122a is, for example, preferably as high as 2.00 W/mK, and a coefficient of thermal expansion of the insulating resin 122a is, for example, preferably as low as 30 or less. Further, an elastic modulus of the insulating resin 122a is, for example, preferably as low as 10 GPa or less. For example, by containing a filler of alumina, aluminum nitride, or the like, in the insulating resin 122a, the heat conductivity of the insulating resin 122a can be improved. A thickness of the insulating resin 122a is, for example, 100 μm or less.

On the other hand, a rolled alloy exemplified as the material of heater electrodes 124 can be used as the material of the metal foil 124a. That is, the metal foil 124a contains, for example, an alloy such as CN49 (constantan) (Cu/Ni/Mn/Fe alloy), Zeranin (Cu/Mn/Sn alloy), or Manganin (Cu/Mn/Ni alloy). The metal foil 124a is, for example, about 25 to 50 thick.

Figure 7:
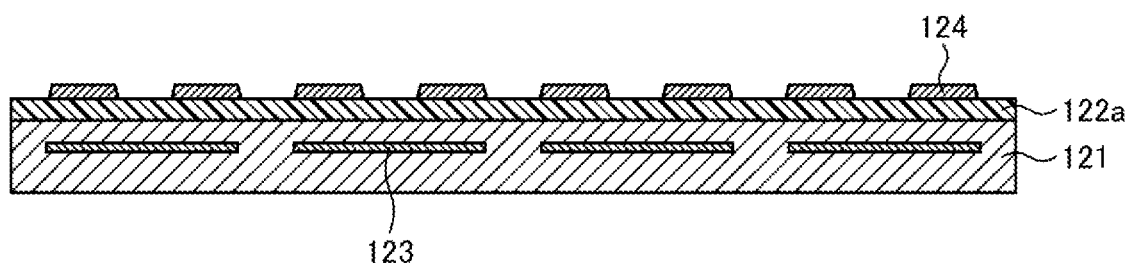
FIG. 7 is a view illustrating a specific example of a heater pattern forming step.

The metal foil 124a is, for example, etched by photolithography so that desired heater patterns are formed (step S103). That is, a resist is formed on an upper face of the metal foil 124a, and the resist is exposed to light and developed. Thus, resist patterns covering portions that will be left as the heater electrodes 124 are formed. Then, the exposed portion of the metal foil 124a uncovered with the resist patterns is removed by etching. As a result, the heater electrodes 124 each having the desired pattern are formed, for example, as shown in FIG. 7. Here, the heater electrodes 124 each having a substantially trapezoidal section are formed.

Figure 8:
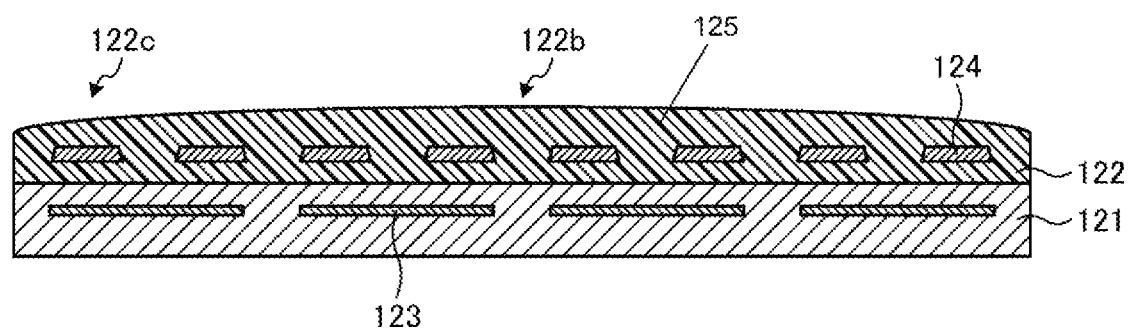
FIG. 8 is a view illustrating a specific example of an insulating resin forming step.

Then, an insulating resin 125 that covers the heater electrodes 124 is formed on the ceramic layer 121 (step S104). Specifically, the insulating resin 125 in a semi-cured state is formed on the ceramic layer 121 so as to cover the insulating resin 122a and the heater electrodes 124. Then, the insulating resin 125 is heated and pressed. Thus, the insulating resin 125 covering the heater electrodes 124 is cured. As a result, a heater layer 122 disposed on the ceramic layer 121 is formed, for example, as shown in FIG. 8.

While the insulating resin 125 is cured, the entire face of the insulating resin 125 is pressed. On this occasion, if fluidity of the insulating resin 125 is high, a portion of the insulating resin 125 in an outer circumferential portion flows to the outside. Therefore, as shown in FIG. 8, an outer circumferential portion 122c of the heater layer 122 is thinner than a central portion 122b of the heater layer 122, thereby resulting in an uneven thickness of the heater layer 122. On the other hand, if the fluidity of the insulating resin 125 is low, the variation in thickness of the insulating resin 125 remains even after the insulating resin 125 is pressed. As a result, the heater layer 122 that is not flat in the surface and has an uneven thickness is formed.

Figure 9:
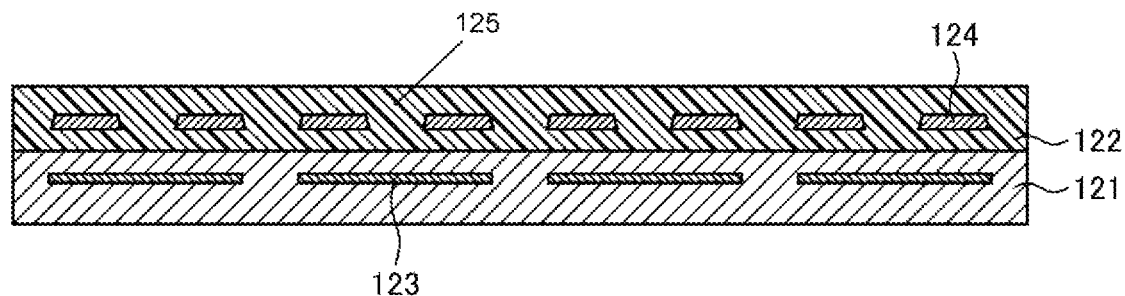
FIG. 9 is a view illustrating a specific example of a precision polishing step.

Therefore, the surface of the heater layer 122 is precisely polished, for example, by a polishing apparatus (step S105). The precision polishing is performed with high accuracy so that, for example, a difference in thickness between a thickest portion and a thinnest portion of the heater layer 122 is not more than 0.2% of the thickness of the heater layer 122. As a result, for example, as shown in FIG. 9, the thickness of the heater layer 122 can be made uniform so that an electrostatic chuck 120 having the ceramic layer 121 and the heater layer 122 having a uniform thickness can be obtained.

Then, the electrostatic chuck 120 is adhesively bonded to a base plate 110 by an adhesive agent (step S106). Specifically, the precisely polished face of the heater layer 122 is adhesively bonded to the base plate 110 by a silane coupling agent layer 131 and an adhesive agent layer 132. On this occasion, the face of the heater layer 122 is precisely polished so that the surface thereof is appropriately roughened. Therefore, close adhesion between the base plate 110 and the heater layer 122 by the adhesive agent is excellent. The electrostatic chuck 120 is adhesively bonded to the base plate 110. Consequently, the substrate fixing device 100 is completed.

In the substrate fixing device 100, the thickness of the heater layer 122 is made uniform by the precision polishing. Accordingly, when the temperature of the ceramic layer 121 is adjusted by the heating from the heater electrodes 124 and the cooling from the base plate 110, sufficiently high heat uniformity can be obtained.

According to the present embodiment, as described above, the surface of the insulating resin covering the heater electrodes is precisely polished. Thus, the thickness of the heater layer 122 made of the insulating resin covering the heater electrodes is made uniform so that the electrostatic chuck 120 having the heater layer 122 and the ceramic layer 121 is adhesively bonded to the base plate 110. Therefore, heat is uniformly conducted from the heater layer 122 and the base plate 110 to the ceramic layer 121 so that uniformity of the heat conducted to the entire face of the ceramic layer 121 can be enhanced. In other words, the substrate fixing device 100 in which, for example, a water or the like is adsorbed by the ceramic layer 121 can obtain sufficiently high heat uniformity.

Figure 10:
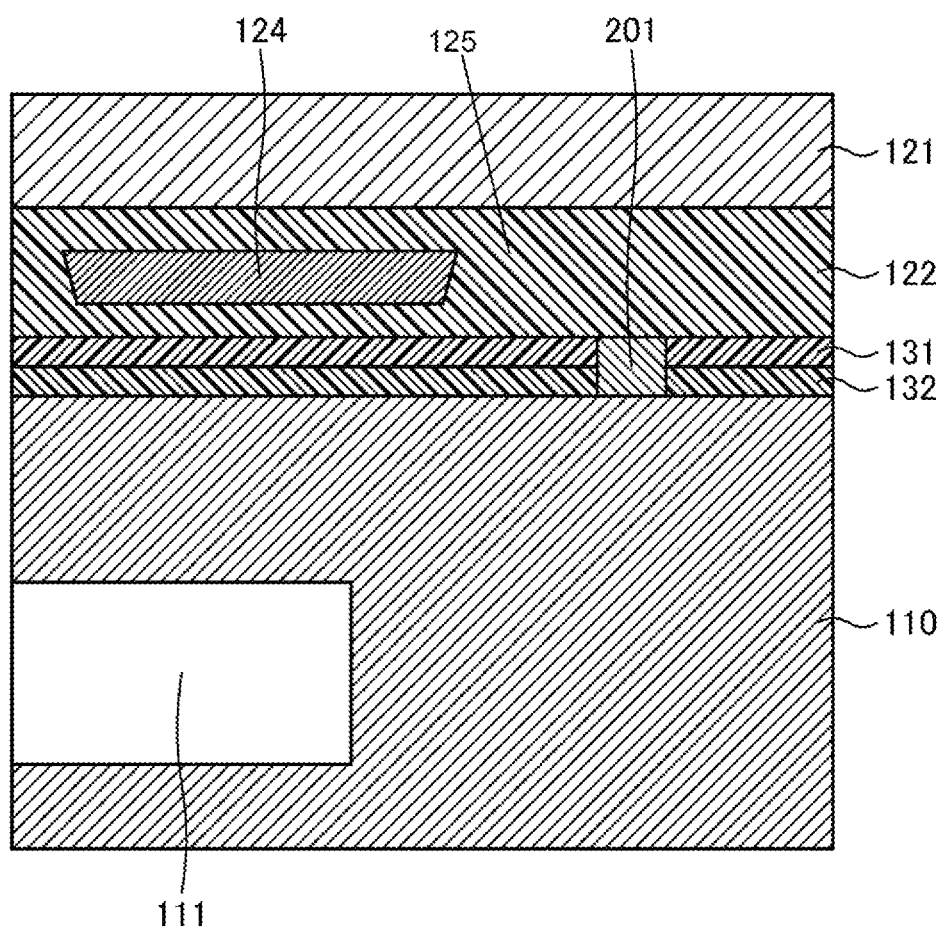
FIG. 10 is an enlarged view illustrating a section of a substrate fixing device according to another embodiment.

Incidentally, in the aforementioned embodiment, the electrostatic chuck 120 is adhesively bonded to the base plate 110 through the silane coupling agent layer 131 and the adhesive agent layer 132. The thicknesses of the silane coupling agent layer 131 and the adhesive agent layer 132 may be made uniform. Specifically, for example, as shown in FIG. 10, a support member 201 that protrudes from the base plate 110 to support the electrostatic chuck 120 is disposed so that a distance between the base plate 110 and the electrostatic chuck 120 can be kept constant. Since the silane coupling agent layer 131 and the adhesive agent layer 132 are formed around the support member 201, the thicknesses of the silane coupling agent layer 131 and the adhesive agent layer 132 can be made uniform. On this occasion, a plurality of support members 201 may be disposed between the base plate 110 and the electrostatic chuck 120. A member molded out of, for example, a silicone resin, an epoxy resin, an acrylic resin, a polyimide resin, etc. with a higher elastic modulus than the silane coupling agent and the adhesive agent can be used as each of the support members 201.

Various aspects of the subject matter described herein are set out non-exhaustively in the following numbered clauses:

1) A method for manufacturing an electrostatic chuck, comprising:

forming an adsorptive layer that comprises an electrode and a ceramic covering the electrode;

providing, on the adsorptive layer, a metal foil layer that comprises an insulating resin and a metal foil provided on the insulating resin;

patterning the metal foil to form a heater electrode;

providing an insulating resin on the adsorptive layer so as to cover the heater electrode: and polishing a surface of the insulating resin exposed to an outside.

What is claimed is:

1. A substrate fixing device comprising:
a base plate; and
an electrostatic chuck that is fixed to the base plate and configured to adsorb a subject by electrostatic force,
wherein the electrostatic chuck comprises:
an adsorptive layer configured to adsorb and retain the subject; and
a heater layer that is provided between the adsorptive layer and the base plate and configured to heat the subject retrained by the adsorptive layer,
wherein the heater layer comprises:
a heater electrode configured to generate heat due to a voltage applied to the heater electrode, the heater electrode having a first surface located on a side of the base plate and a second surface located on an opposite side of the first surface and located on a side of the adsorptive layer, and
an insulating resin that covers at least the first surface of the heater electrode, and
wherein a thickness of the heater layer including the insulating resin is uniform over an entire area of the heater layer.

2. The substrate fixing device according to claim 1, wherein the adsorptive layer comprises:
an electrode to which a voltage can be applied, and
a ceramic that covers the electrode.

3. The substrate fixing device according to claim 1, wherein the insulating resin comprises:
a first face that faces the adsorptive layer, and
a second face that is opposite to the first face and that faces the base plate, and
the second face is formed as a flat face.

4. The substrate fixing device according to claim 1, wherein the insulating resin contains a filler.

5. The substrate fixing device according to claim 1, wherein:
the base plate comprises a refrigerant flow path through which a refrigerant passes.

6. The substrate fixing device according to claim 1, further comprising:
an adhesive layer that is provided between the electrostatic chuck and the base plate to bond the electrostatic chuck and the base plate to each other.

7. The substrate fixing device according to claim 6, further comprising:
a support member that protrudes from the base plate to support the electrostatic chuck,
wherein the adhesive layer is provided between the electrostatic chuck and the base plate so as to surround the support member.

8. The substrate fixing device according to claim 1, wherein
a difference in thickness between a thickest portion and a thinnest portion of the heater layer is not more than 0.2% of an average thickness of the heater layer.

9. An electrostatic chuck comprising:
a heater layer; and
an adsorptive layer that is disposed on the heater layer and configured to adsorb and retain a subject by electrostatic force,
wherein the heater layer is configured to heat the subject retained by the adsorptive layer,
wherein the heater layer comprises:
a heater electrode configured to generate heat due to a voltage applied to the heater electrode, the heater electrode having a first surface located on a side of the base plate and a second surface located on an opposite side of the first surface and located on a side of the adsorptive layer, and
an insulating resin that covers at least the first surface of the heater electrode, and
wherein a thickness of the heater layer including the insulating resin is uniform over an entire area of the heater layer.

* * * * *